(12) United States Patent
Lee

(10) Patent No.: US 12,317,647 B2
(45) Date of Patent: May 27, 2025

(54) LIGHT EMITTING DEVICE USING MICROMETER-SIZED SEMICONDUCTOR LIGHT EMITTING DIODE, AND METHOD FOR MANUFACTURING SAME

(71) Applicant: LG ELECTRONICS INC., Seoul (KR)

(72) Inventor: Eunah Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 631 days.

(21) Appl. No.: 17/616,845

(22) PCT Filed: Jun. 20, 2019

(86) PCT No.: PCT/KR2019/007430
§ 371 (c)(1),
(2) Date: Dec. 6, 2021

(87) PCT Pub. No.: WO2020/251106
PCT Pub. Date: Dec. 17, 2020

(65) Prior Publication Data
US 2022/0310879 A1 Sep. 29, 2022

(30) Foreign Application Priority Data
Jun. 13, 2019 (KR) .................. 10-2019-0070015

(51) Int. Cl.
*H10H 20/83* (2025.01)
*H10H 20/01* (2025.01)
(Continued)

(52) U.S. Cl.
CPC ........ *H10H 20/8312* (2025.01); *H10H 20/01* (2025.01); *H10H 20/814* (2025.01);
(Continued)

(58) Field of Classification Search
CPC ... H01L 27/30; H01L 27/3239; H01L 31/143; H01L 31/162; H01L 33/08; H01L 33/18;
(Continued)

(56) References Cited

U.S. PATENT DOCUMENTS

2006/0071228 A1 4/2006 Sun
2010/0053929 A1 3/2010 Bisberg
(Continued)

FOREIGN PATENT DOCUMENTS

KR 10-0731673 B1 6/2007
KR 10-2017-0028082 A 3/2017

*Primary Examiner* — Moin M Rahman
(74) *Attorney, Agent, or Firm* — Birch, Stewart, Kolasch & Birch, LLP

(57) ABSTRACT

A light-emitting device using a micrometer-sized semiconductor light-emitting element can include a substrate including a plurality of individual device areas; a semiconductor structure located in each of the plurality of individual device areas, in which the semiconductor structure includes a first conductive semiconductor layer, an active layer, and a second conductive semiconductor layer; a first electrode electrically connected to the first conductive semiconductor layer of the semiconductor structure; a second electrode electrically connected to the second conductive semiconductor layer of the semiconductor structure; and a light extraction structure located in a gap area located outside of the device area on the substrate.

11 Claims, 17 Drawing Sheets

(51) Int. Cl.
  *H10H 20/814* (2025.01)
  *H10H 20/831* (2025.01)
  *H10H 20/857* (2025.01)

(52) U.S. Cl.
  CPC ......... *H10H 20/857* (2025.01); *H10H 20/032* (2025.01); *H10H 20/0364* (2025.01)

(58) Field of Classification Search
  CPC ... H01L 33/24; H01L 51/5032; H01L 25/048; H01L 27/288; H01L 27/32; H01L 33/06; H01L 33/26; H01L 51/0032; H01L 51/50; H01L 2251/50; H01L 51/5068; H01L 51/5084; H01L 51/5296; H01L 2051/0032; H01L 2227/32; H01L 25/167; H01L 33/52–56; H01L 51/448; H01L 51/5209; H01L 27/3262; H01L 27/3258; H01L 27/3248; H01L 27/322; H01L 51/5225; H01L 51/5268; H01L 2251/558; H01L 2251/303; H01L 2251/306; H01L 2251/308; H01L 51/5218; H01L 51/5271; H01L 51/5275; H01L 51/0005; H01L 51/5012; H01L 51/5206; H01L 51/5221; H01L 51/56; H01L 27/3244; H01L 2227/323; H10H 20/8312; H10H 20/01; H10H 20/857; H10H 20/032; H10H 20/0364; H10H 20/0363; H10H 20/855; H10H 20/819; H10H 20/856; H10H 20/82; H10H 20/831; H10H 20/00–882; H10H 29/00–142; H10H 29/30–962; H10H 20/814–8142; H10H 20/0145; H10H 20/826–8262; H10H 20/013–0137; H10H 20/824–8252; H10H 20/012–0125; H10H 20/823–8232; H10H 20/0165; H10H 20/817–818; H10H 20/052; F21K 9/00–278

See application file for complete search history.

(56) References Cited

U.S. PATENT DOCUMENTS

| | | |
|---|---|---|
| 2011/0018017 A1 | 1/2011 | Bierhuizen et al. |
| 2013/0049011 A1 | 2/2013 | Brandes |
| 2014/0231748 A1* | 8/2014 | Kim ........................ H01L 33/06 257/13 |
| 2016/0079061 A1* | 3/2016 | Tanigawa ............ H01L 21/0262 257/618 |

* cited by examiner

LIGHT EMITTING DEVICE USING MICROMETER-SIZED SEMICONDUCTOR LIGHT EMITTING DIODE, AND METHOD FOR MANUFACTURING SAME

CROSS REFERENCE TO RELATED APPLICATIONS

This application is the National Phase of PCT International Application No. PCT/KR2019/007430, filed on Jun. 20, 2019, which claims priority under 35 U.S.C. § 119 (a) to Patent Application No. 10-2019-0070015, filed in the Republic of Korea on Jun. 13, 2019, all of these applications being hereby expressly incorporated by reference into the present application.

BACKGROUND

Technical Field

The present disclosure is applicable to a display device-related technical field, and relates, for example, to a light-emitting device using a micro LED (light emitting diode) and a method for manufacturing the same.

BACKGROUND ART

A semiconductor light-emitting element is an element whose range of application is expanding because of low-power and high-efficiency characteristics thereof, and is particularly attracting attention in a next-generation lighting field.

In particular, a light emitting diode (LED) generates light by exciting electrons across a bandgap between a conduction band and a valence band of a semiconductor active light-emitting layer. Electronic transition generates light with a wavelength based on the band gap. Therefore, a color (the wavelength) of the light emitted by the LED depends on a semiconductor material of an active layer of the LED.

Such LED is able to be driven at a relatively low voltage, and has advantages of low heat generation and long lifespan resulted from a high energy efficiency thereof, and is expected to be able to replace most of light-emitting devices currently used as a scheme that may provide white light, which has been difficult to implement in the prior art, with high luminance is developed.

Further, a range of applications of the LED is gradually diversifying, such as being applied not only to a display device using light-emitting, but also to a backlight element of a lighting device or an LCD display device.

Such LED is gradually being developed as a high-power LED. However, on the other hand, a scheme for implementing a display device or a light-emitting device using a small-sized (in one example, micrometer-sized) LED (hereinafter, a micro LED) is gradually receiving attention.

As described above, as the display device and the light-emitting device are implemented using the micro LED, importance of miniaturization and selective transfer of a chip is greatly recognized.

In one example, when the micro LED is formed, an area where a semiconductor structure does not exist exists between the LEDs for a semiconductor process, which is generally regarded as a light loss area.

Therefore, there is a need for a method for efficiently using such light loss area.

In one example, among technologies to increase a reflection efficiency in the light-emitting element, a reflectivity is approximately 92% in a case of vertical incident light when using reflective metals (Ag and Al), and the reflectivity of the vertical incident light is almost 100% when using a multi-reflective film (distributed Bragg reflector; DBR) structure. However, there was a problem that such high reflectivity decreases sharply based on an angle of incidence.

SUMMARY

Technical Problem

A purpose of an embodiment of the present disclosure is to provide a light-emitting device using a micrometer-sized (μm) semiconductor light-emitting element and a method for manufacturing the same.

Another purpose of an embodiment of the present disclosure is to provide a light-emitting device with an improved light extraction efficiency using a micrometer-sized (μm) semiconductor light-emitting element and a method for manufacturing the same.

Another purpose of an embodiment of the present disclosure is to provide a light-emitting device with an improved light extraction efficiency by applying a light extraction structure to an area between individual elements of a micrometer-sized (μm) semiconductor light-emitting element, and a method for manufacturing the same.

Another purpose of an embodiment of the present disclosure is to provide a light-emitting device with an improved light extraction efficiency by applying a reflective structure showing high reflectivity regardless of an angle of incidence to an area between individual elements of a micrometer-sized (μm) semiconductor light-emitting element, and a method for manufacturing the same.

Furthermore, a purpose of an embodiment of the present disclosure is to solve various problems not mentioned herein. Those skilled in the art may understand this through the whole spirit of the specification and drawings.

Technical Solutions

As a first aspect for achieving the above technical problem, in the present disclosure, a gas heat pump including a gas engine having an engine combustion portion with a plurality of combustion spaces with spark plugs, the gas heat pump includes a target setting operation of setting a target ignition energy amount based on a refrigerant load amount determined based on an operating condition of the gas heat pump, an ignition operation of igniting a fuel injected into the combustion space, a comparison operation of comparing an output energy amount emitted in the ignition operation with the target ignition energy amount set in the target setting operation, and an amount of changing an amount of energy required to ignite the fuel when the output energy amount and the target ignition energy amount do not match in the comparison operation.

According to an embodiment of the present disclosure, an omni-directional reflector (ODR) structure may be formed without an additional process using an empty loss space defined when a micrometer-sized light emitting diode (LED) is formed.

Therefore, improvement of luminance of a light-emitting device may be expected by allowing light generated inside the LED to be effectively emitted to the outside without being lost in the surroundings. Such improved optical properties may reduce deterioration of an element in terms of high-temperature reliability, and thus a positive effect on long-term reliability may be expected.

As a specific example, the present disclosure may include a semiconductor element located in an individual device area and a light extraction structure located in a gap area located outwardly of the individual device area.

As a more specific example, in the present disclosure, a light-emitting device using a micrometer-sized semiconductor light-emitting element, includes a substrate including a plurality of individual device areas, a semiconductor structure located in the individual device area, wherein the semiconductor structure includes a first conductive semiconductor layer, an active layer, and a second conductive semiconductor layer, a first electrode electrically connected to the first conductive semiconductor layer of the semiconductor structure, a second electrode electrically connected to the second conductive semiconductor layer of the semiconductor structure, and a light extraction structure located in a gap area located outwardly of the device area on the substrate.

Further, the gap area may be located between two adjacent individual device areas.

Further, the light extraction structure may include a semiconductor protruding structure located on the substrate.

Further, the light extraction structure may include an omni-directional reflector (ODR).

Further, the omni-directional reflector may include a semiconductor protruding structure positioned on the gap area of the substrate, a passivation layer positioned on the semiconductor protruding structure, and a metal layer placed on the passivation layer.

Further, the metal layer may be connected to at least one of the first electrode and the second electrode.

Further, the semiconductor protruding structure may contain the same material as the semiconductor structure.

Further, a reflective metal layer may be located on a side surface of the semiconductor structure.

Further, the reflective metal layer may be connected to at least one of the first electrode and the second electrode.

Further, the light-emitting device may further include an insulating layer stacked on the light extraction structure located in the gap area.

Further, the light-emitting device may further include a first wiring electrode connected to the first electrode, and a second wiring electrode connected to the second electrode.

Further, at least one of the first wiring electrode and the second wiring electrode may be located on an insulating layer.

As another more specific example, in the present disclosure, a method for manufacturing a light-emitting device using a micrometer-sized semiconductor light-emitting element includes forming a semiconductor structure including a first conductive semiconductor layer, an active layer, and a second conductive semiconductor layer on a growth substrate, forming a protruding structure in a gap area located outwardly of a device area on the growth substrate, forming a passivation layer on at least a portion of the semiconductor structure on the device area and on the protruding structure, and forming a first electrode and a second electrode respectively electrically connected to the first conductive semiconductor layer and the second conductive semiconductor layer of the semiconductor structure and formed on the passivation layer located on the protruding structure.

Further, the protruding structure may be formed by etching the semiconductor structure located on the gap area.

Further, the method may further include transferring the semiconductor structure and the protruding structure together.

Further, the transferring of the semiconductor structure and the protruding structure may include using a flexible film in contact with the semiconductor structure and the protruding structure.

Further, the method may further include forming an insulating layer on the transferred protruding structure.

Further, the method may further include forming a first wiring electrode and a second wiring electrode respectively connected to the first electrode and the second electrode.

Further, at least one of the first wiring electrode and the second wiring electrode may be located on the insulating layer.

Further, the protruding structure, the passivation layer located on the protruding structure, and the first electrode or the second electrode located on the passivation layer may be formed to be sequentially in contact with each other to form an omni-directional reflector (ODR) structure.

Advantageous Effects

According to an embodiment of the present disclosure, the light-emitting device using the micrometer-sized ($\mu$m) semiconductor light-emitting element and the method for manufacturing the same may be provided.

Further, the light-emitting device with the improved light extraction efficiency using the micrometer-sized ($\mu$m) semiconductor light-emitting element, and the method for manufacturing the same may be provided.

Further, the omni-directional reflector (ODR) structure may be formed without the additional process using the empty loss space defined when the micrometer-sized light emitting diode (LED) is formed.

Therefore, the luminance of the light-emitting device may be improved by allowing the light generated inside the LED to be effectively emitted to the outside without being lost in the surroundings. Such improved optical properties may reduce the deterioration of the element in terms of the high-temperature reliability, and thus the positive effect on the long-term reliability may be expected.

Furthermore, according to another embodiment of the present disclosure, there are additional technical effects not mentioned herein. Those skilled in the art will be able to understand such additional technical effects through the full text of the specification and drawings.

Figure 2A:
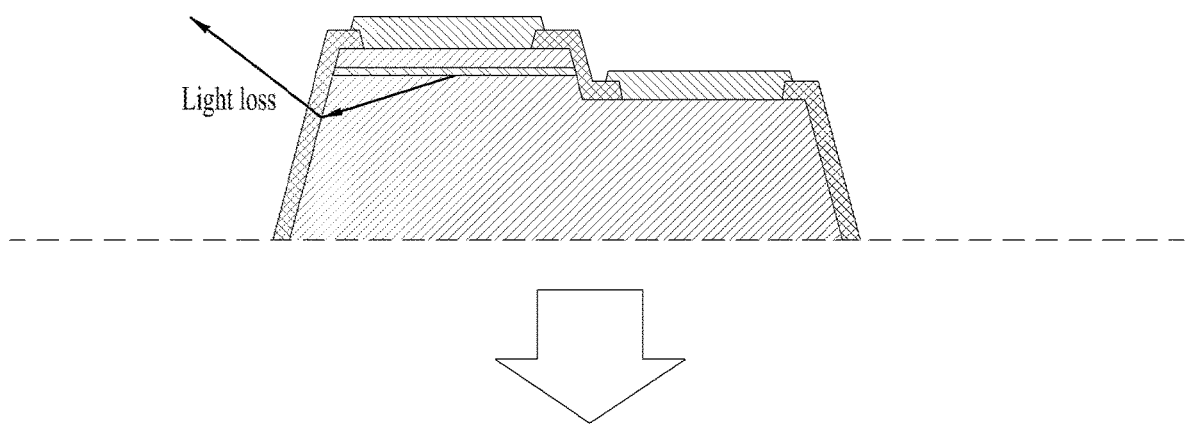
Figure 2B:
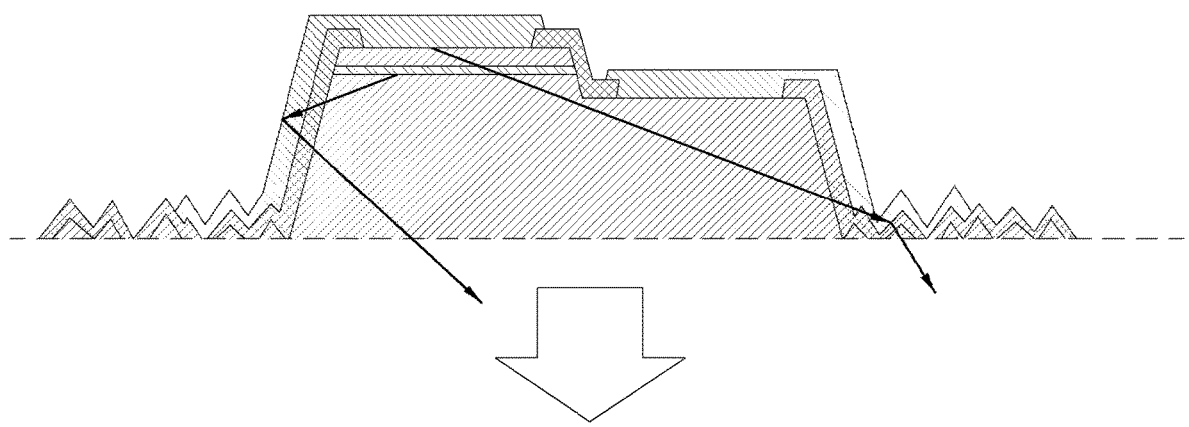

(a) in FIG. 2 is a schematic diagram showing a path of light of a light-emitting device without a reflective structure applied to a gap area.

(b) in FIG. 2 is a schematic diagram showing a path of light of a light-emitting device according to an embodiment of the present disclosure.

FIGS. 3 to 8 are cross-sectional schematic views showing a manufacturing process of an individual light-emitting element according to an embodiment of the present disclosure.

FIGS. 9 to 15 are cross-sectional schematic views showing a transfer process of an individual light-emitting element according to an embodiment of the present disclosure.

Figure 16:
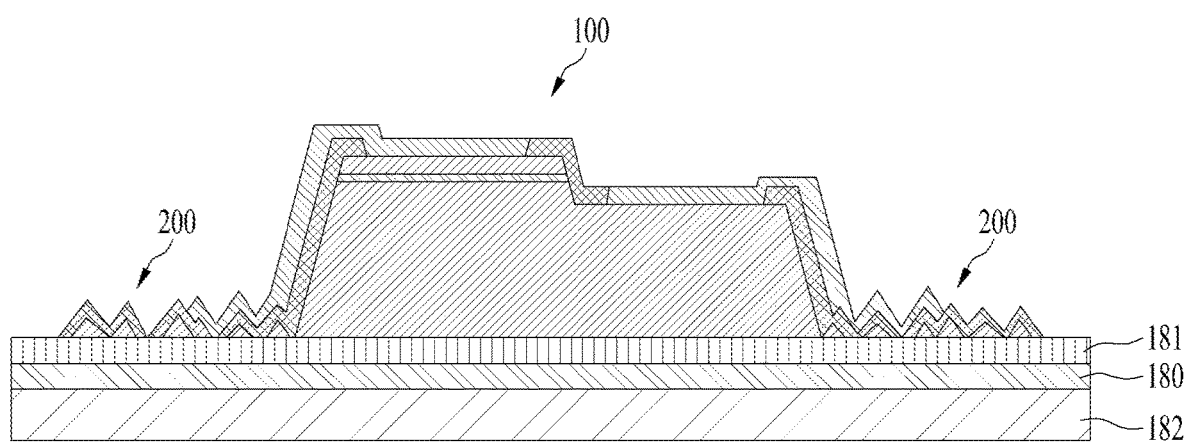
Figure 17:
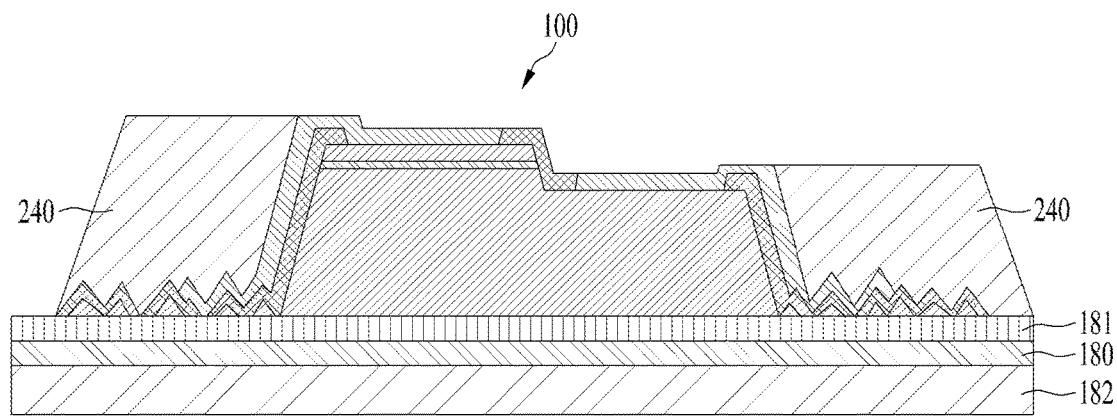
Figure 18:
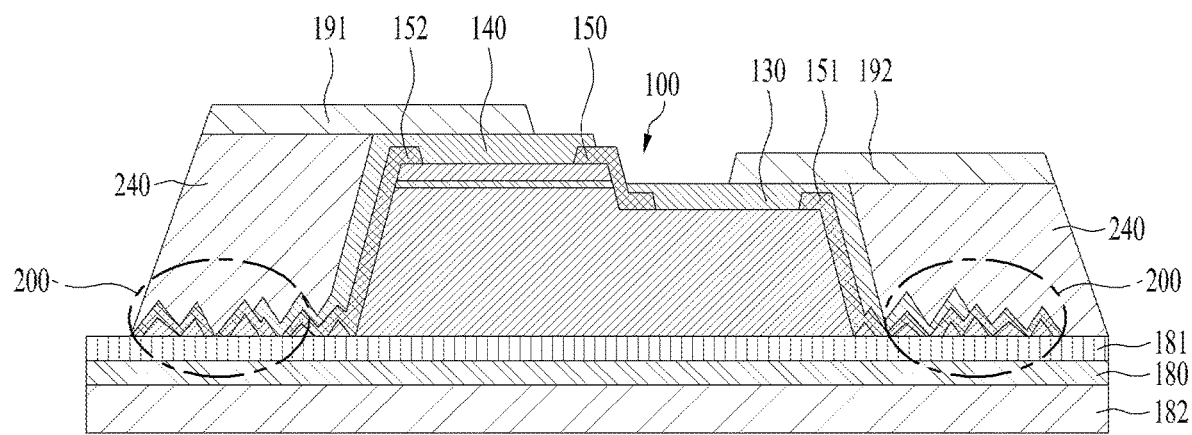

FIGS. 16 to 18 are cross-sectional views showing a process of manufacturing a light-emitting device according to an embodiment of the present disclosure.

Figure 19:
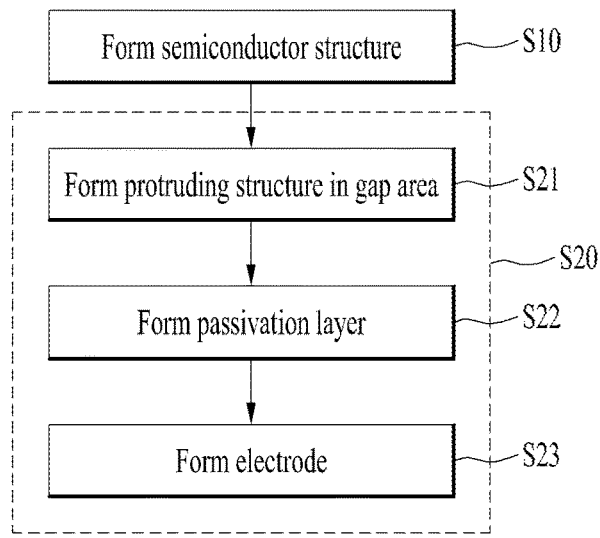
Figure 20:
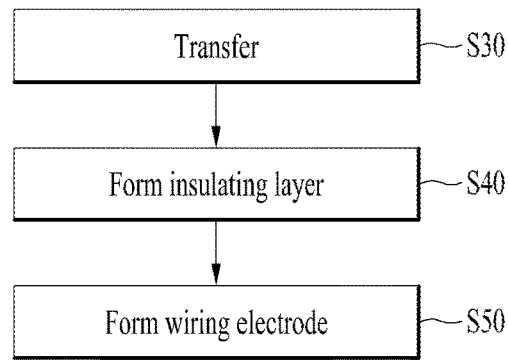

FIGS. 19 and 20 are flowcharts showing a manufacturing process of a light-emitting device using a semiconductor light-emitting element according to an embodiment of the present disclosure.

Figure 21:
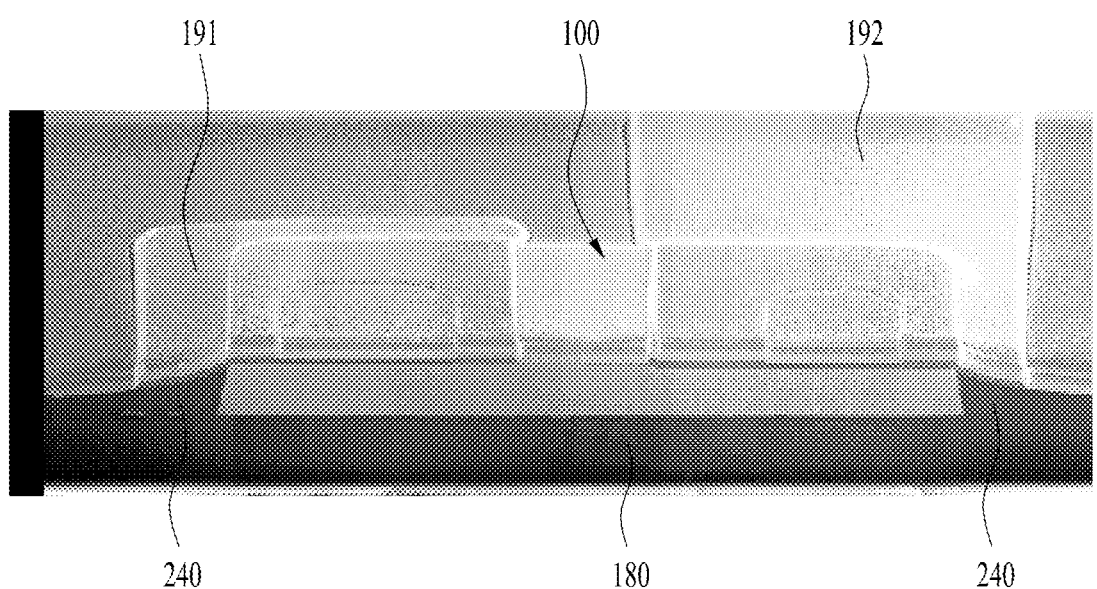

FIG. 21 is a photograph showing a portion of a light-emitting device according to an embodiment of the present disclosure.

Figure 22:
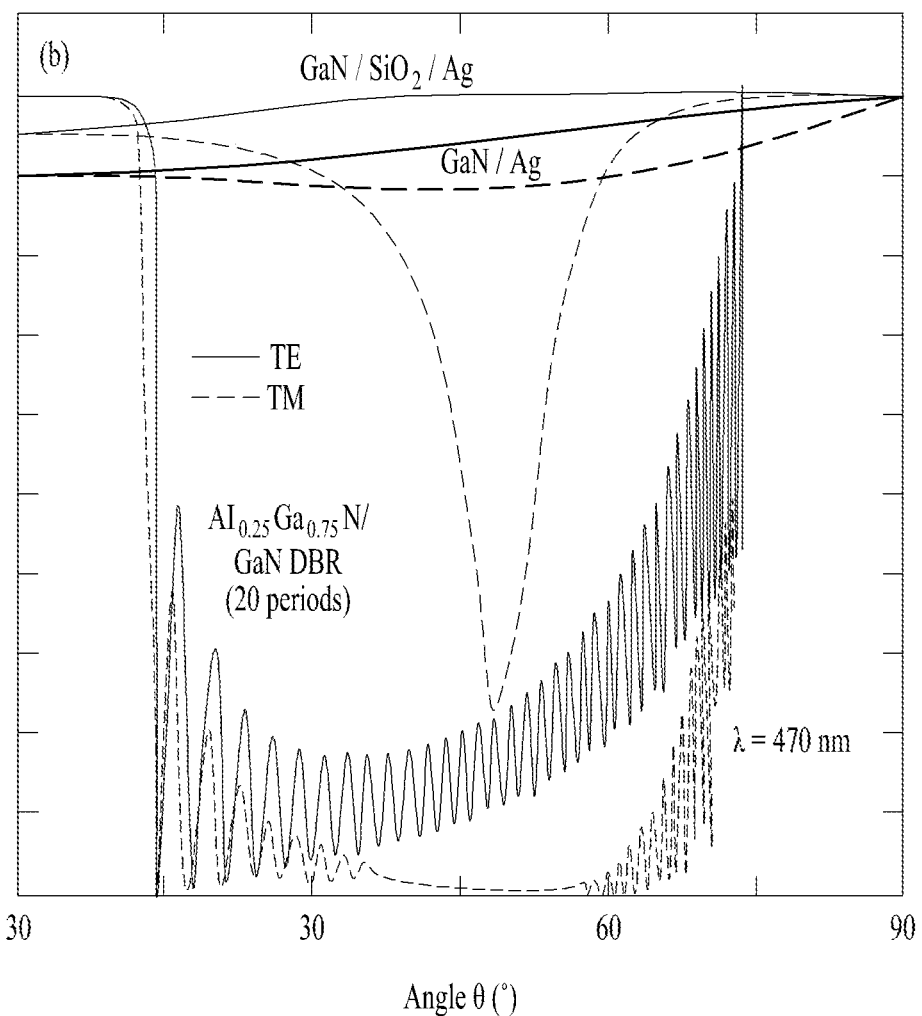

FIG. 22 is a graph showing reflectivity based on an angle of incidence of each reflective structure.

Figure 23:
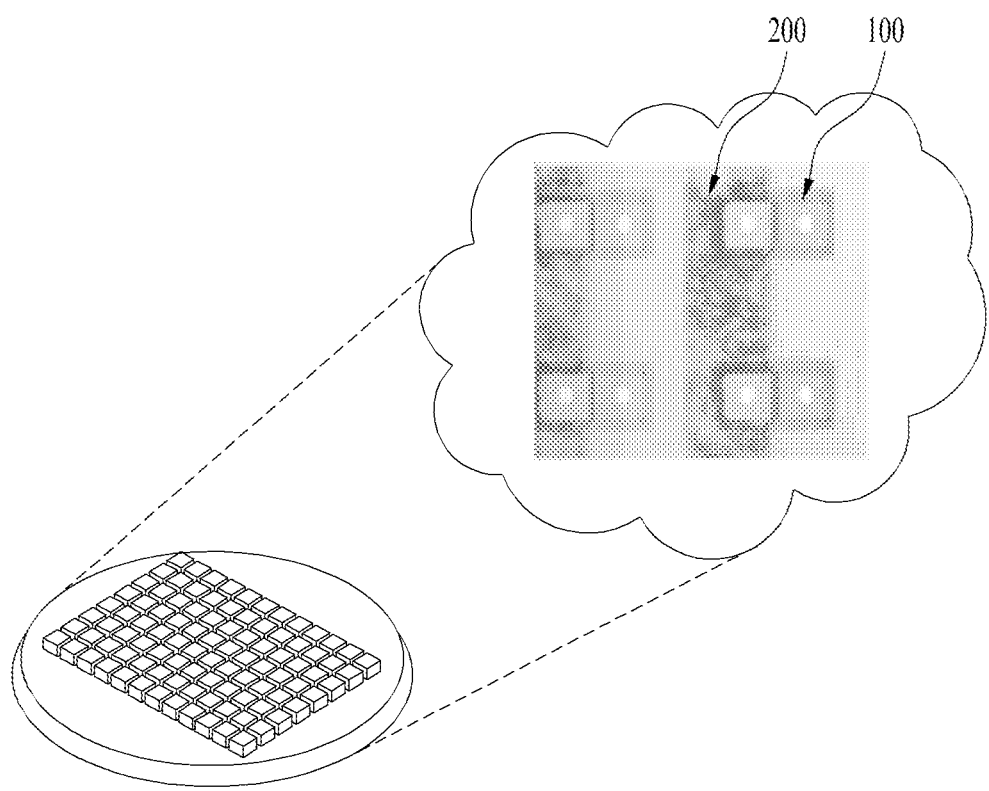

FIG. 23 is an enlarged photograph of a light-emitting device according to an embodiment of the present disclosure.

Figure 24:
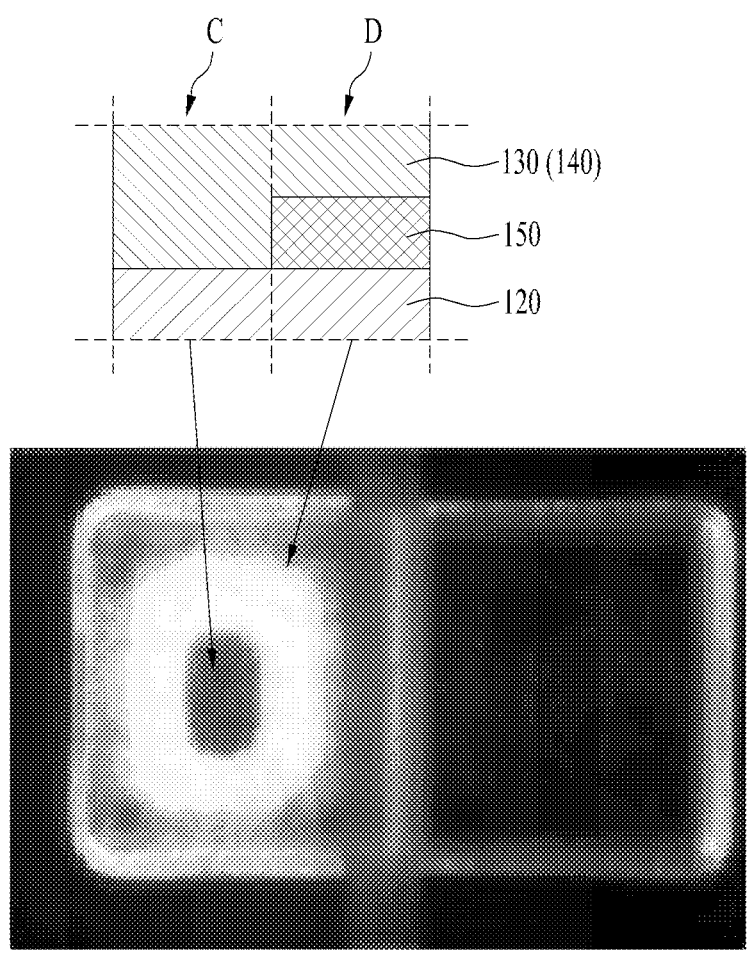

FIG. 24 is a photograph showing an effect of an ODR structure on a light-emitting element structure related to FIG. 23.

Figure 25:
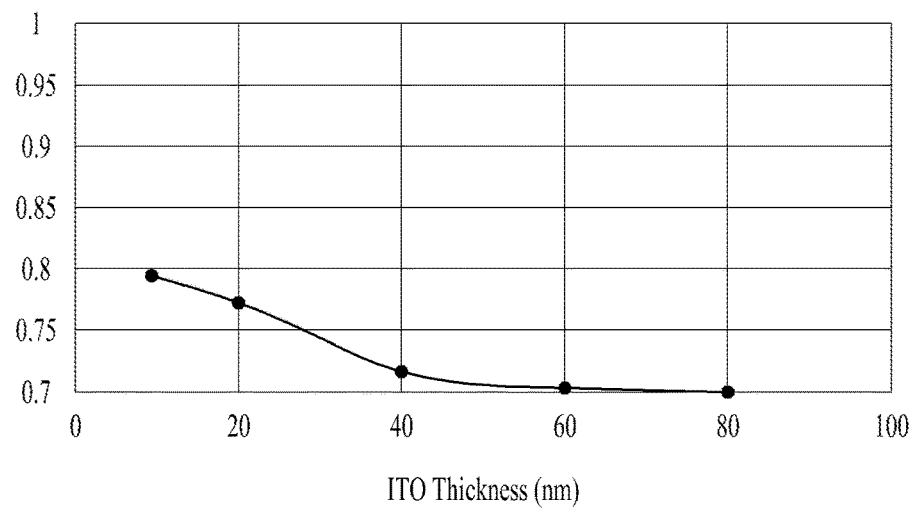

FIG. 25 is a graph showing average reflectivity in a first area.

Figure 26:
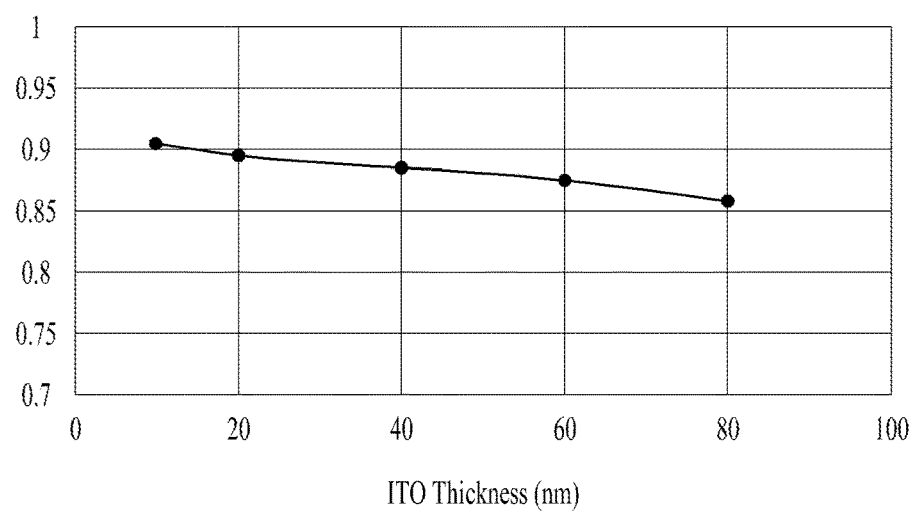

FIG. 26 is a graph showing average reflectivity in a second area.

Figure 27:
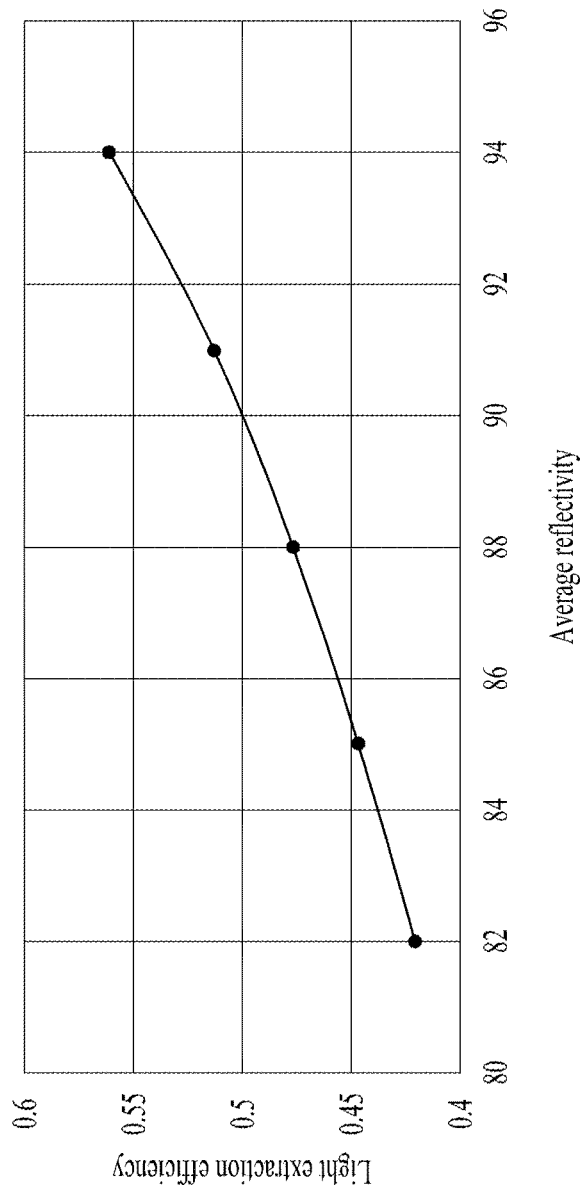

FIG. 27 is a graph showing average reflectivity when surface texture is applied to a light-emitting element.

DETAILED DESCRIPTION OF THE EMBODIMENTS

Hereinafter, an embodiment according to the present disclosure will be described in detail with reference to the accompanying drawings.

While the present disclosure allows for several modifications and variations, specific embodiments thereof are illustrated and shown in drawings, which will be described in detail below. However, it is not intended to limit the present disclosure to a particular form disclosed. Rather, the present disclosure includes all modifications, equivalents, and substitutions consistent with the spirit of the present disclosure as defined by the claims.

Hereinafter, an embodiment disclosed in the present specification will be described in detail with reference to the accompanying drawings. Regardless of the drawings, the same or similar components are assigned the same reference numerals, and duplicated descriptions thereof will be omitted. The suffixes "module" and "unit" for the components used in the following description are given or mixed in consideration of only the ease of writing of the specification, and do not have distinct meanings or roles by themselves. In addition, in describing the embodiment disclosed herein, when it is determined that a detailed description of a related known technology may obscure the gist of the embodiment disclosed herein, the detailed description thereof will be omitted. In addition, the accompanying drawings are only for easy understanding of the embodiment disclosed herein, and it should be understood that the technical idea disclosed herein is not limited by the accompanying drawings.

Furthermore, although each drawing is described for convenience of description, it is also within the scope of the present disclosure that those skilled in the art implement another embodiment by combining at least two drawings.

Further, when a component such as a layer, an area, or a substrate is referred to as being "on" another component, it will be understood that it may be directly on another component or there may be an intermediate component therebetween.

A light-emitting device described in the present disclosure is a concept including all light-emitting devices and display devices that display information as a unit pixel or a set of unit pixels. Therefore, it may be applied not only to a finished product but also to parts. For example, a panel corresponding to a part of a digital TV also independently corresponds to the display device in the present disclosure. The finished products may include a mobile phone, a smart phone, a laptop computer, a terminal for digital broadcasting, a PDA (personal digital assistant), a PMP (portable multimedia player), a navigation, a slate PC, a tablet PC, an ultra book, a digital TV, a desktop computer, various lighting devices, a lamp for an automobile, and the like.

However, those skilled in the art will readily appreciate that the configuration according to the embodiment described in the present disclosure may be applied to a display-capable-device even in a new product form to be developed later.

Further, a semiconductor light-emitting element mentioned in this specification includes an LED, a micro LED, and the like.

Figure 1:
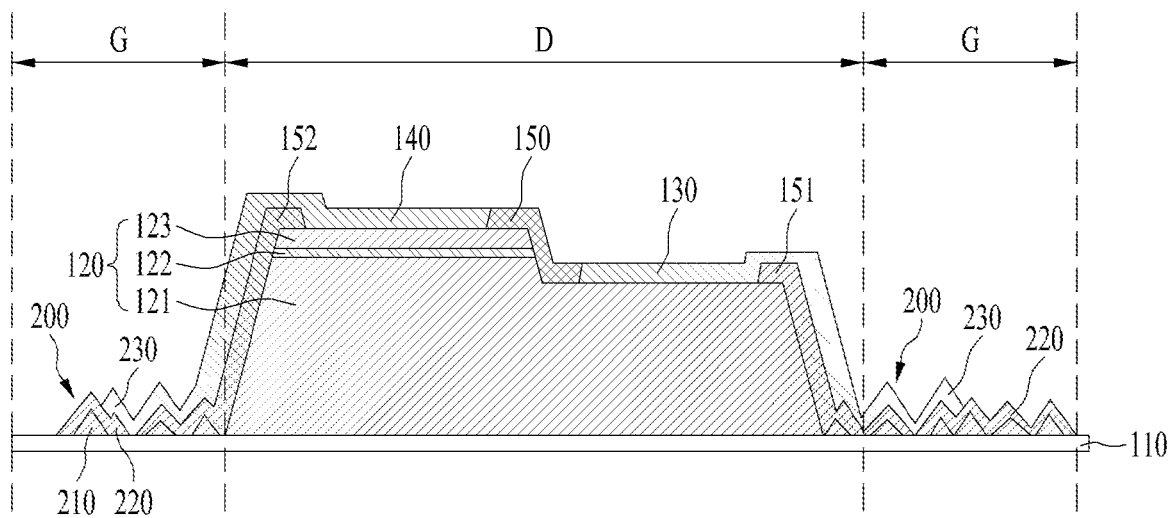
FIG. 1 is a cross-sectional view showing a unit light-emitting area of a light-emitting device according to an embodiment of the present disclosure.

FIG. 1 is a cross-sectional view showing a unit light-emitting area of a light-emitting device according to an embodiment of the present disclosure.

Referring to FIG. 1, a unit light-emitting area of a light-emitting device according to an embodiment of the present disclosure may include an device area D in which a unit (individual) semiconductor light-emitting element 100 is located, and a gap area G located outwardly of such device area D. That is, the device area D and the gap area G may be partitioned on a substrate 110, and the unit light-emitting element 100 may be located in such device area D.

In this connection, the unit (individual) semiconductor light-emitting element (LED) 100 may have a size in units of micrometers (μm). That is, the size in units of micrometers (μm) may mean that a width of at least one surface of the light-emitting element 100 has a size of several to several hundred micrometers (μm). Such a light-emitting element LED 100 having the size in units of micrometers (μm) may be referred to as a micro LED.

The substrate 110 may be a growth substrate on which a semiconductor structure constituting the light-emitting element 100 is grown. In one example, the substrate 110 may be a substrate to which the light-emitting element 100 manufactured on the growth substrate is transferred. For example, such substrate to which the light-emitting element 100 is transferred may be a flexible substrate. In the case of the substrate to which the light-emitting element 100 is transferred, an adhesive layer may be located between the light-emitting element 100 and the substrate to which the light-emitting element 100 is transferred. Further, such adhesive layer may be a portion of the substrate to which the light-emitting element 100 is transferred.

First, the case in which the substrate 110 is the growth substrate will be described with respect to a unit light-emitting area of the light-emitting device, for example.

As such, the light-emitting device may be positioned on the substrate 110 including a plurality of individual device areas D.

A semiconductor structure 120 including a first conductive semiconductor layer 121, an active layer 122, and a second conductive semiconductor layer 123 may be located in the individual device area D on the substrate 110. Such a semiconductor structure 120 may be formed with a nitride semiconductor thin film represented by gallium nitride (GaN). In one example, the first conductive semiconductor layer 121 may be an n-type semiconductor layer, and the second conductive semiconductor layer 123 may be a p-type semiconductor layer. Hereinafter, an embodiment of the present disclosure will be described with the example in which the first conductive semiconductor layer 121 is the n-type semiconductor layer and the second conductive semiconductor layer 123 is the p-type semiconductor layer.

Referring to FIG. 1, the light-emitting element 100 may have a so-called horizontal light-emitting element structure in which open surfaces of the n-type semiconductor layer 121 and the p-type semiconductor layer 123 are oriented in the same direction. However, the present disclosure is not limited thereto.

A passivation layer 150, 151, and 152 may be positioned on the semiconductor structure 120. Such passivation layer 150, 151, and 152 may be a layer for insulating or protecting the semiconductor structure 120.

The passivation layer may include a first passivation layer 151 located on one side surface of the semiconductor structure 120, a second passivation layer 152 located on the other side surface of the semiconductor structure 120, and a third passivation layer 153 positioned between the open surfaces of the n-type semiconductor layer 121 and the p-type semiconductor layer 123.

In fact, because the passivation layer is able to be formed to cover an entire outer surface of the semiconductor structure 120, the first passivation layer 151 may be a layer in contact with the n-type semiconductor layer 121, and the second passivation layer 152 may be a layer in contact with all of the n-type semiconductor layer 121, the active layer 122, and the p-type semiconductor layer 123.

A first electrode (n-type electrode) 130 may be electrically connected to and positioned on the open surface of the n-type semiconductor layer 121, and a second electrode (p-type electrode) 140 may be electrically connected to and positioned on the open surface of the p-type semiconductor layer 123.

In one example, a light extraction structure 200 may be located in the gap area G, which is a peripheral area of the device area D. Such light extraction structure 200 may allow light emitted from the light-emitting element 100 to be reflected and emitted without being lost in such gap area G.

As shown, such light extraction structure 200 may include a protruding structure 210 located on the substrate 110. Such protruding structure 210 may be made of a semiconductor material. For example, the protruding structure 210 may contain the same material as that of the semiconductor structure 120.

A dielectric layer 220 may be positioned on the protruding structure 210. Such dielectric layer 220 may be made of the same material as that of the passivation layer 151 and 152. Accordingly, the dielectric layer may be described with the same terms as those of the passivation layer. Such dielectric layer 220 may be located in connection with the passivation layer 151 and 152 described above. For example, the dielectric layer 220 may be formed together when the passivation layer 151 and 152 is formed.

A metal layer 230 may be positioned on the dielectric layer 220. Such metal layer 230 may be positioned in connection with the first electrode 130 and the second electrode 140. Similarly, the metal layer 230 may be formed together when the first electrode 130 and the second electrode 140 are formed. That is, the metal layer 230 may be formed to extend from the first electrode 130 and the second electrode 140.

As described above, when the metal layer 230 is formed to extend from the first electrode 130 and the second electrode 140, the metal layer 230 is also located on the side surface of the semiconductor structure 120, and such metal layer 230 is able to act as a reflective metal layer.

In one example, the stack structure of the protruding structure 210, the passivation layer 220, and the metal layer 230 described above may achieve an omni-directional reflector (ODR) structure. Such an omni-directional reflector (ODR) structure may allow the light emitted from the light-emitting element 100 to be reflected and emitted without being lost in such gap area G.

In general, when only the reflective metal layer is used, a surface texture structure is used, or a multiple reflective layer structure (e.g., a DBR structure) is used to improve reflectivity, the reflectivity decreases rapidly depending on an angle of incidence of light. However, the above-mentioned ODR structure may maintain a relatively high reflectivity for wide wavelength and incident angle of light ranges. Advantages of such an ODR structure will be described later in detail.

As described with reference to FIG. 1, the light-emitting element 100 that emits the light is located in the plurality of individual device areas D, and the light extraction structure 200, that is, the ODR structure 200 as described above, may be located in the gap area G located between such device areas D.

(a) in FIG. 2 is a schematic diagram showing a path of light of a light-emitting device without a reflective structure applied to a gap area. Further, (b) in FIG. 2 is a schematic diagram showing a path of light of a light-emitting device according to an embodiment of the present disclosure.

First, referring to (a) in FIG. 2, a structure of a (downwardly light-emitting) device that emits light downwardly is shown. Light emitted from the active layer 122 of the semiconductor structure 120 may be emitted in all directions. In this connection, a portion of light emitted upward may be reflected at the metal layer and emitted downward, but light emitted to the side surface of the semiconductor structure 120 or the gap area is likely to be lost. For example, the light emitted to the gap area may not be emitted downward depending on an incident angle thereof and may be reflected at an interface.

Referring to (b) in FIG. 2, a structure of a (downwardly light-emitting) device that emits light downwardly is shown. The light emitted from the active layer 122 of the semiconductor structure 120 may be emitted in all directions. In this connection, the light emitted upward is mostly reflected from the metal layer composed of the first electrode 130 and the second electrode 140 and may be emitted downward.

Further, the light emitted to the side surface of the semiconductor structure 120 may also be reflected from the metal layer composed of the first electrode 130 and the second electrode 140 and may be emitted downward.

Furthermore, the light emitted to the gap area may be reflected or refracted by the ODR structure 200 and emitted downward. Therefore, light extraction efficiency and a light efficiency of the light-emitting device according to an embodiment of the present disclosure in which the ODR structure 200 is implemented in the gap area may be greatly improved.

FIGS. 3 to 8 are cross-sectional schematic views showing a manufacturing process of an individual light-emitting element according to an embodiment of the present disclosure. FIGS. 3 to 8 show a manufacturing process of the semiconductor light-emitting element 100 having the ODR structure 200 on the substrate 110.

In one example, FIGS. 19 and 20 are flowcharts showing a manufacturing process of a light-emitting device using a semiconductor light-emitting element according to an embodiment of the present disclosure. Hereinafter, in describing the manufacturing process of the light-emitting device using the semiconductor light-emitting element according to an embodiment of the present disclosure, a cross-sectional view of the corresponding device and one of the flowcharts in FIGS. 19 and 20 will be referred to together.

Figure 3:
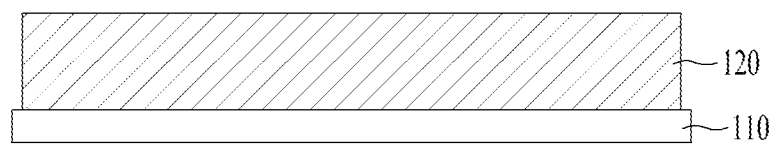

First, referring to FIG. 3, the semiconductor layer (the semiconductor structure 120) may be formed on the substrate 110 (S10). In this connection, the substrate 110 may be the growth substrate such as sapphire, silicon, GaN, or SiC.

Further, the semiconductor structure 120 may include the first conductive semiconductor layer 121, the active layer 122, and the second conductive semiconductor layer 123. As mentioned above, such a semiconductor structure 120 may be formed with the nitride semiconductor thin film represented by gallium nitride (GaN). In one example, the first conductive semiconductor layer 121 may be the n-type semiconductor layer, and the second conductive semiconductor layer 123 may be the p-type semiconductor layer.

Figure 4:
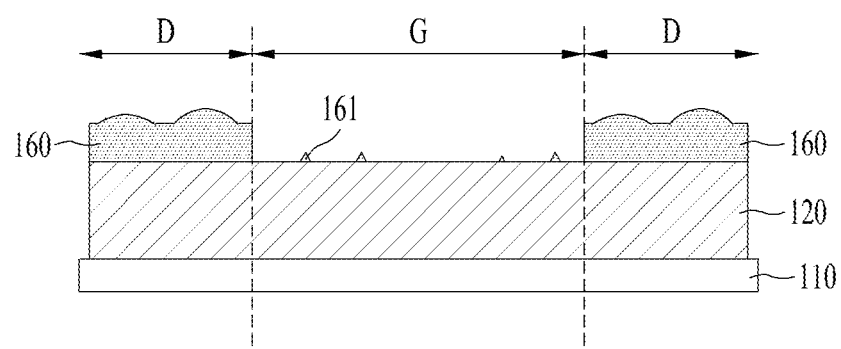

Referring to FIG. 4, such semiconductor layer 120 may be divided into the plurality of device areas D and the gap area G located between such device areas D. In this connection, at least a portion of the semiconductor layer 120 located in the gap area G may be removed to separate the individual device area G. Through such process, the semiconductor layer 120 may be formed as the individual semiconductor element 100. Hereinafter, a process S20 of forming such an individual semiconductor element 100 will be described.

To this end, a mask layer 160 may be formed in the device area D, and an island-shaped mask 161 for forming a protruding structure may be formed in the gap area G.

Figure 5:
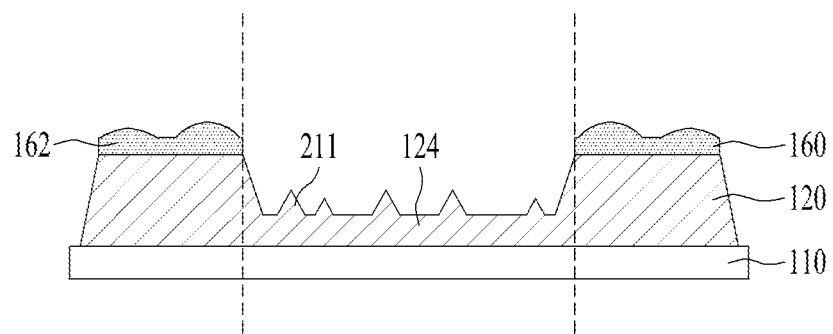

As such, an etching process is performed in the state in which the mask layer 160 and the island-shaped mask 161 are formed. Then, as shown in FIG. 5, an intermediate process in which a mesa-type semiconductor structure 120 is formed in the device area D and a protrusion 211 is located on the etched semiconductor layer 124 in the gap area G may be performed. That is, FIG. 5 shows the intermediate process in which the etching is performed. In this connection, it may be seen that the mask layer 162 thinned by the etching is located on the semiconductor structure 120.

Figure 6:
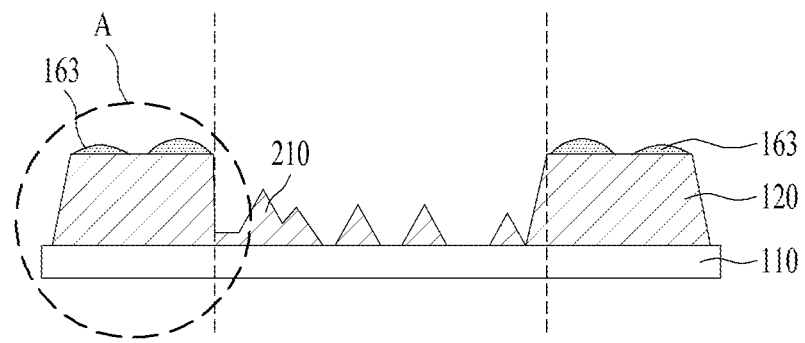

Thereafter, when further etching is performed, as shown in FIG. 6, the protruding structure 210 may be formed in the gap area G (S21), and the semiconductor structure 120 may be located in the device area D.

In this connection, after the etching is completed, a residual mask layer 163 may be located on a portion of the semiconductor structure 120. When such residual mask layer 163 remains, the residual mask layer 163 may be removed through additional processing. Further, additional etching may be performed such that a portion of the first conductive semiconductor layer (n-type semiconductor layer) 121 is exposed from the top. Thereafter, the passivation layer may be formed at a position except for an exposed area for forming an electrode (S22).

Figure 7:
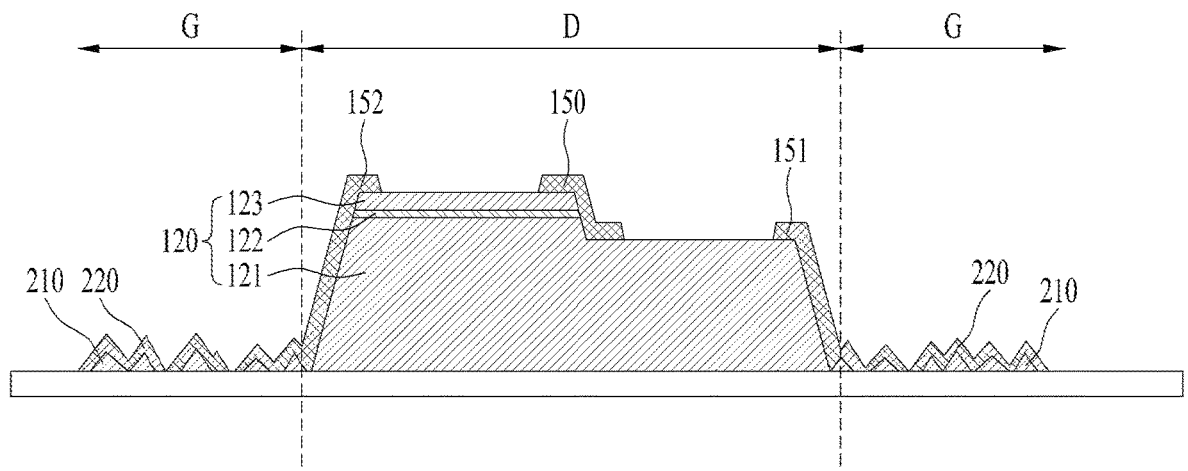
Figure 8:
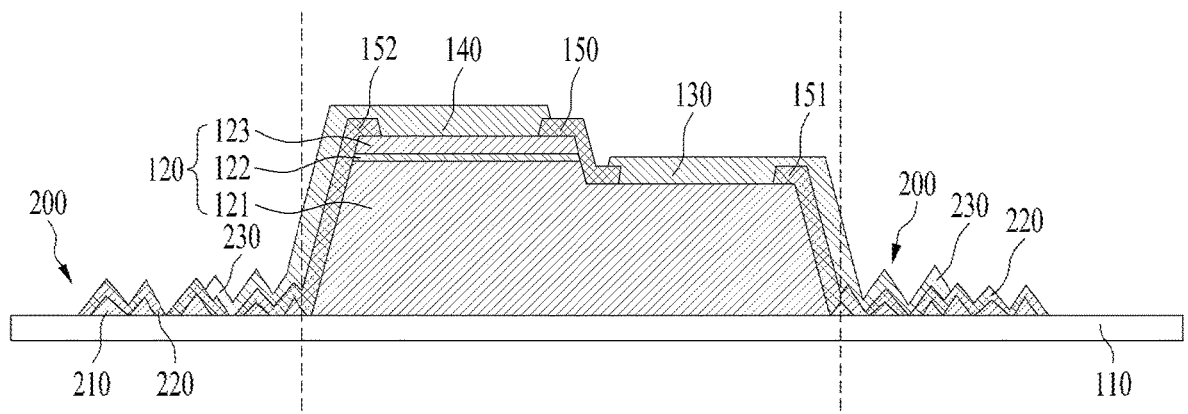

FIG. 7 is an enlarged view of a portion A in FIG. 6. The semiconductor structure 120 in which the n-type semiconductor layer 121, the active layer 122, and the p-type semiconductor layer 123 are sequentially located from the substrate 110 may be located in the device area D where individual elements are located. Further, the protruding structure 210 and the dielectric layer (passivation layer) 220 positioned on such protruding structure 210 may be located in the gap area G located outwardly of the device area D, that is, outwardly of the semiconductor structure 120.

In this connection, the passivation layer 150 located in the device area D may cover top surfaces of the n-type semiconductor layer 121 and the p-type semiconductor layer 123 except for exposed portions for forming the electrodes.

As mentioned above, the passivation layer may include the first passivation layer 151 located on one side surface of the semiconductor structure 120, the second passivation layer 152 located on the other side surface of the semiconductor structure 120, and the third passivation layer 153 positioned between the open surfaces of the n-type semiconductor layer 121 and the p-type semiconductor layer 123.

In fact, because the passivation layer is able to be formed to cover the entire outer surface of the semiconductor structure 120, the first passivation layer 151 may be the layer in contact with the n-type semiconductor layer 121, and the second passivation layer 152 may be the layer in contact with all of the n-type semiconductor layer 121, the active layer 122, and the p-type semiconductor layer 123.

Thereafter, the first electrode 130 and the second electrode 140 may be formed in the exposed portions for forming the electrodes of the top surfaces of the n-type semiconductor layer 121 and the p-type semiconductor layer 123, respectively (S23). Then, a state shown in FIG. 8 may be formed, which may be substantially the same as the structure in FIG. 1 described above.

In this connection, the first electrode 130 and the second electrode 140 may also be formed on the side surface of the semiconductor structure 120. That is, the first electrode 130 and the second electrode 140 may be formed to extend to the side surface of the semiconductor structure 120.

Further, the first electrode 130 and the second electrode 140 formed to extend to the side surface of the semiconductor structure 120 may also be formed to extend to the gap area G. Therefore, the gap area G may have the structure in which the protruding structure 210, the passivation layer 220 located on such protruding structure 210, and the metal layer 230 located on such passivation layer 220 and on which the first electrode 130/the second electrode 140 are extending are sequentially stacked. The structure located in such gap area G may form a light extraction structure. Such light extraction structure 200 may allow the light emitted from the light-emitting element 100 to be reflected and emitted without being lost in such gap area G.

More specifically, such protruding structure 210, passivation layer 220, and metal layer 230 on which the first electrode 130/the second electrode 140 are extending are sequentially formed in contact with each other to achieve the omni-directional reflector (ODR) structure 200.

The individual semiconductor light-emitting element 100 formed as described above may be transferred onto the substrate constituting the display device or the light-emitting device (S30).

FIGS. 9 to 15 are cross-sectional schematic views showing a transfer process of an individual light-emitting element according to an embodiment of the present disclosure. FIGS. 9 to 15 show a process of transferring the semiconductor light-emitting element 100 having the ODR structure 200 structure onto the substrate 110 to manufacture the display device or the light-emitting device.

In FIGS. 9 to 15, the individual light-emitting element 100 and the ODR structure 200 are shown briefly and simply for convenience of description.

Figure 9:
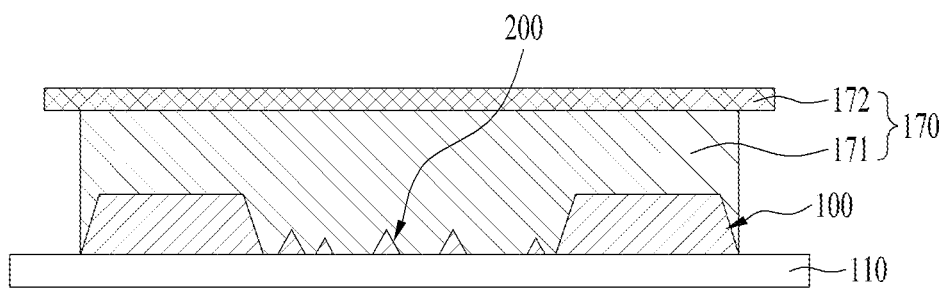

First, referring to FIG. 9, it is possible to position a transfer film 170 on the individual light-emitting element 100 and the ODR structure 200. Such transfer film 170 may selectively transfer some of the plurality of individual light-emitting elements 100. That is, it is possible to selectively transfer some desired light-emitting elements 100 based on a placement and a structure of the light-emitting device or the display device to be manufactured.

The transfer film 170 may be a flexible film suitable for such selective transfer. Such transfer film 170 may include a flexible adhesive layer 171 and a substrate 172.

Referring to FIG. 9, the adhesive layer 171 may be adhered to both the individual semiconductor light-emitting element 100 and the ODR structure 200. The adhesive layer 171 may be flexible, and in fact, a difference in height between the semiconductor element 100 and the ODR structure 200 may exist within a range of such flexibility.

Figure 10:
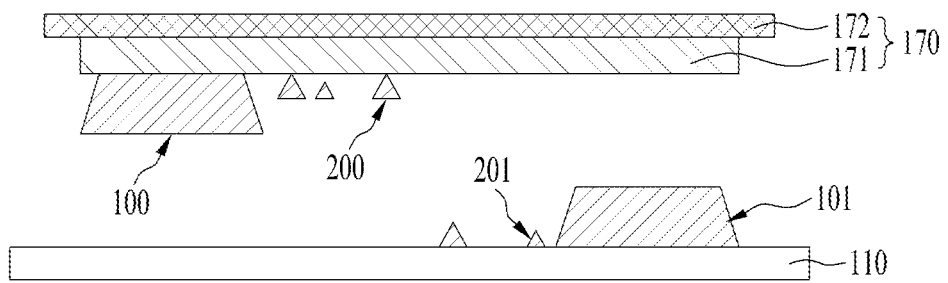

Thereafter, as shown in FIG. 10, primary selective transfer may be made through the transfer film 170. Such primary selective transfer may mean a process of separating the desired light-emitting element 100 and ODR structure 200.

In this connection, in order to separate such light-emitting element 100 and ODR structure 200 to the growth substrate 110, a laser lift off (LLO) process may be performed. That is, when laser light is irradiated to the light-emitting element 100 and the ODR structure 200 to be separated from the growth substrate 110, the growth substrate 110 and the corresponding light-emitting element 100 and ODR structure 200 may be separated from each other.

The light-emitting element 100 and the ODR structure 200 separated as such may be transferred by the transfer film 170. In this connection, the light-emitting element 101 and the ODR structure 201 to which the laser light is not irradiated may remain on the substrate 110 as it is.

Figure 11:
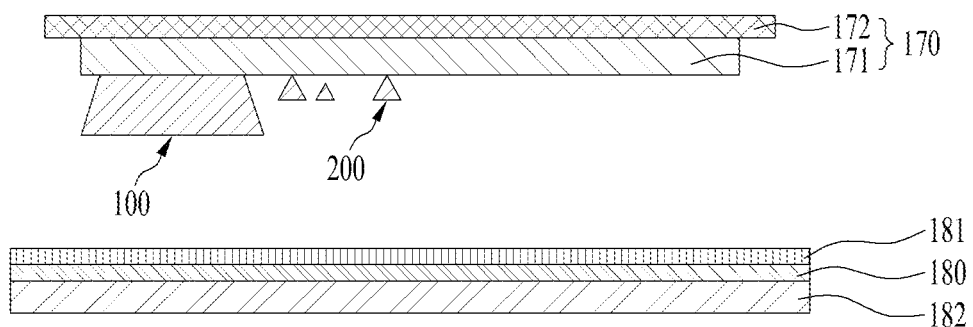

Next, as shown in FIG. 11, the light-emitting element 100 and the ODR structure 200 transferred by the transfer film 170 may be secondarily transferred to an intermediate substrate or a final substrate.

In FIG. 11, a process in which the light-emitting element 100 and the ODR structure 200 transferred by the transfer film 170 is transferred to a transparent film 180 is shown. An adhesive layer 181 for the transfer may be located on such transparent film 180. In addition, a temporary substrate 182 may be located on the other side of the transparent film 180.

In this connection, the transparent film 180 may be a flexible film. Further, the temporary substrate 182 may be a glass substrate.

As shown, the light-emitting element 100 and the ODR structure 200 transferred by the transfer film 170 for the secondary transfer may be positioned on the transparent film 180.

Figure 12:
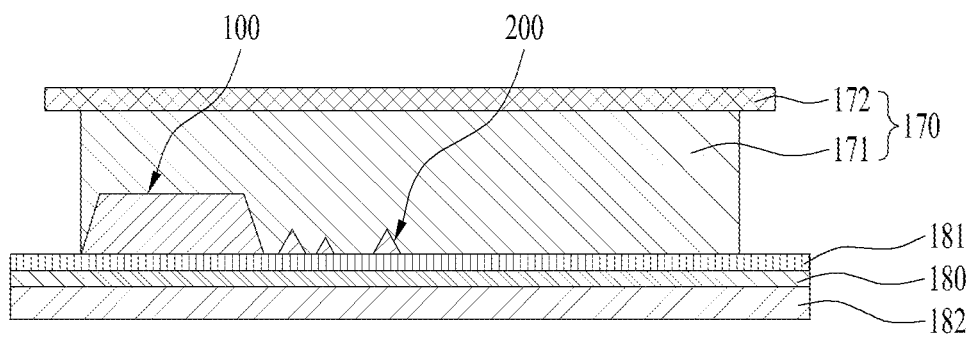

Thereafter, as shown in FIG. 12, the light-emitting element 100 and the ODR structure 200 transferred by the transfer film 170 may be attached to the transparent film 180.

In this connection, as described above, the adhesive layer 171 of the transfer film 170 is flexible, so that a structure of the light-emitting element 100 and the ODR structure 200 before the transfer may be positioned on the transparent film 180 as it is.

Figure 13:
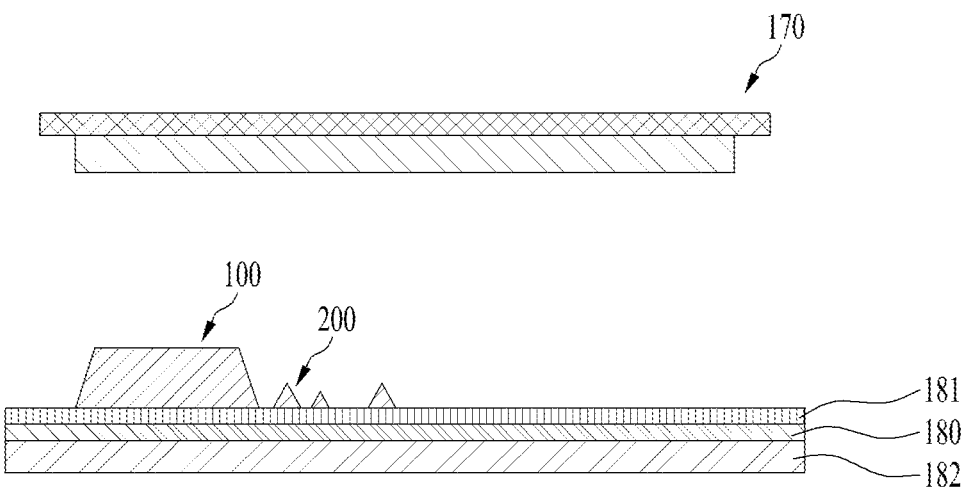
Figure 14:
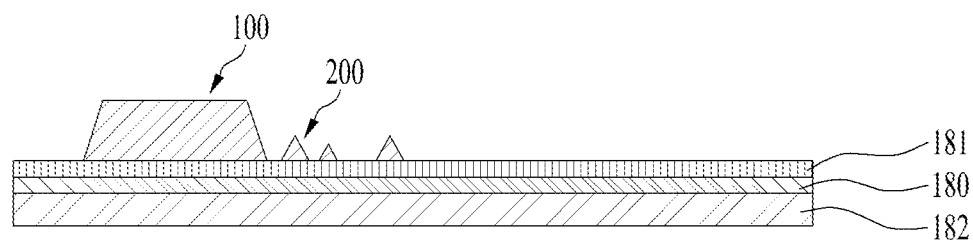

Next, as shown in FIG. 13, a process of removing the transfer film 170 may be performed. Then, as shown in FIG. 14, the structure of the light-emitting element 100 and the ODR structure 200 may be transferred as it is onto the intermediate substrate or the final substrate in which the temporary substrate 182, the transparent film 180, and the adhesive layer 181 are sequentially positioned.

Such selective transfer process (S30) may be performed repeatedly. For example, the transfer process may be repeatedly performed based on a desired position and a light-emitting element that emits a desired color.

Figure 15:
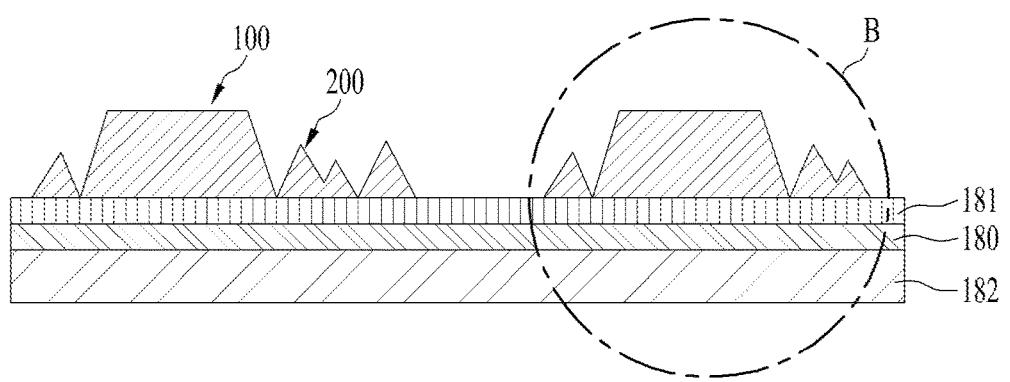

Then, a structure shown in FIG. 15 may be achieved. That is, structures of a plurality of light-emitting elements 100 and ODR structures 200 may be arranged with a preset spacing on the intermediate substrate or the final substrate in which the temporary substrate 182, the transparent film 180, and the adhesive layer 181 are sequentially positioned. The arrangement of the plurality of light-emitting elements 100 and the ODR structures 200 may vary depending on a design of the corresponding display device or light-emitting device.

FIGS. 16 to 18 are cross-sectional views showing a process of manufacturing a light-emitting device according to an embodiment of the present disclosure.

FIGS. 16 to 18 show a process of manufacturing the light-emitting device using the light-emitting element 100 and the ODR structure 200 transferred in the above process.

FIG. 16 shows an enlarged view of a portion B in FIG. 15. As shown, the ODR structure 200 may be located on at least one side of the light-emitting element 100. FIG. 16 shows a state in which the ODR structures 200 are respectively transferred on both sides of (or in a form surrounding) the light-emitting element 100, but such ODR structure 200 may be located only on one side of the light-emitting element 100. That is, the ODR structure 200 may be disposed in a structure of surrounding only one side of the light-emitting element 100.

Thereafter, as shown in FIG. 17, an insulating layer 240 may be formed on the ODR structure 200 (S40). Such insulating layer 240 may be formed for planarization for forming a wiring electrode.

Such insulating layers 240 disposed on both sides of the light-emitting element 100 may have different heights. For example, such a height difference may correspond to a height difference between the n-type semiconductor layer 121 and the p-type semiconductor layer 123.

Next, as shown in FIG. 18, a first wiring electrode 192 electrically connected to the first electrode (n-type electrode) 130 and a second wiring electrode 191 electrically connected to the second electrode (p-type electrode) 140 may be formed (S50).

The first wiring electrode 192 and the second wiring electrode 191 may be extended and located on the insulating layer 240. A portion of each of the first wiring electrode 192 and the second wiring electrode 191 may be positioned on the ODR structure 200, but such first wiring electrode 192 and second wiring electrode 191 may not substantially overlap the ODR structure 200.

FIG. 21 is a photograph showing a portion of a light-emitting device according to an embodiment of the present disclosure.

That is, FIG. 21 is a photograph showing actual implementation of the structure shown in FIG. 18 above. Referring to FIG. 21, it may be seen that the structure described with reference to FIGS. 3 to 18 is achieved in the same manner.

FIG. 22 is a graph showing reflectivity based on an angle of incidence of each reflective structure.

Referring to FIG. 22, the reflectivity based on the angle of incidence when a metal reflector (GaN/Ag) is used for the light-emitting element, when the multi-reflective film (DBR) (AlGaN/GaN DBR) is used, and when the ODR structure (GaN/SiO$_2$/Ag) applied to the present disclosure is used are shown.

First, it may be seen that the reflectivity is relatively low and varies greatly depending on the angle of incidence when the multi-reflective film (DBR) (AlGaN/GaN DBR) is used.

First, it may be seen that such reflective film composed of the semiconductor/dielectric/metal maintains higher reflectivity for a wide angle of incidence compared to the multi-reflective film (DBR) or the metal reflector when the ODR structure (GaN/SiO$_2$/Ag) applied to the present disclosure is used.

Therefore, it may be seen that such an excellent effect may be exhibited even in the case of the light-emitting device according to an embodiment of the present disclosure to which the ODR structure 200 having the substantially same structure is applied.

Furthermore, because the ODR structure 200 applied to the light-emitting device according to an embodiment of the present disclosure includes the protruding structure 210, the light extraction efficiency may be improved. That is, light incident to the interface where the ODR structure 200 is located may not be able to be extracted to the light extraction surface depending on the incident angle. However, the corresponding light may also be able to be extracted to the light extraction surface as reflective surfaces of various angles are provided by such protruding structure 210.

Further, because the dielectric layer 220 and the metal layer 230 on the protruding structure 210 also have protrusion shapes, the light extraction efficiency may be further improved.

FIG. 23 is an enlarged photograph of a light-emitting device according to an embodiment of the present disclosure.

Referring to FIG. 23, an enlarged picture on the right shows the light-emitting element 100 and the ODR structure 200 formed on an actual substrate. FIG. 23 shows an example in which the ODR structure 200 is formed only in a partial area.

That is, in one example, in the light-emitting element 100, a region in which the p-type electrode 140 is formed and a region in which the n-type electrode 130 is formed respectively form squares and are adjacent to each other.

In this connection, the ODR structure 200 may be formed in a shape surrounding a region in which one electrode is formed, for example, the region in which the p-type electrode 140 is formed.

FIG. 24 is a photograph showing an effect of an ODR structure on a light-emitting element structure related to FIG. 23.

That is, referring to FIG. 24, it may be seen that a light-emitting state may vary depending on the area of the light-emitting element when the light-emitting element is manufactured in a shape similar to that in FIG. 23.

In FIG. 24, a central area (hereinafter, a first area) of the light-emitting element indicated by C represents an area in which the semiconductor structure 120 and the metal film (the first electrode 130 or the second electrode 140) are stacked. Further, a peripheral area (hereinafter, a second area) indicated by D represents an area in which the semiconductor structure 120, the dielectric (the passivation layer) 150, and the metal film (the first electrode 130 or the second electrode 140) are stacked, that is, an area substantially forming the ODR structure.

As described above, it may be seen that the light-emitting states in the first area and the second area are different. That is, it may be seen that the light-emitting state of the first area C constituting the semiconductor/metal structure is relatively bad. However, it may be seen that the light-emitting state is relatively excellent in the second area D, which forms the semiconductor/dielectric/metal ODR structure.

Further, it may be seen that the light-emitting state is also excellent in the outer area of the light-emitting element. This may be improved light extraction by the ODR structure 200 located in the gap area G.

FIG. 25 is a graph showing average reflectivity in a first area, and FIG. 26 is a graph showing average reflectivity in a second area.

Referring to FIG. 25, average reflectivity in the first area C based on an ITO thickness when an ITO (indium tin oxide) is used as the electrode is shown.

Further, referring to FIG. 26, similarly, average reflectivity in the second area D based on the ITO thickness when the ITO (indium tin oxide) is used as the electrode is shown.

When comparing FIGS. 25 and 26, for example, it may be seen that the average reflectivity reaches about 90% in the case of FIG. 26 to which the ODR structure is applied when the ITO having a thickness of 20 nm is applied. However, it may be seen that the average reflectivity is about 77% in the case of FIG. 25 to which the ODR structure is not applied.

FIG. 27 is a graph showing average reflectivity when surface texture is applied to a light-emitting element. That is, FIG. 27 shows the light extraction efficiency when surface texture (a protruding structure) is applied in the two cases shown in FIGS. 25 and 26.

When the average reflectivity is increased from about 77% to about 90% by applying the ODR structure, that is, when the surface texture is applied in such cases of FIGS. 25 and 26, the light extraction efficiency is able to increase from 0.4 to 0.5. As such, in the case of using the ODR structure and the light extraction structure (protruding structure), the light extraction efficiency is able to increase by 20%.

As such, according to an embodiment of the present disclosure, the omni-directional reflector (ODR) structure may be formed without an additional process using an empty loss space defined when the micrometer-sized light emitting diode LED is formed.

Therefore, the luminance of the light-emitting device may be improved by allowing the light generated inside the LED to be effectively emitted to the outside without being lost in the surroundings. Such improved optical properties may reduce deterioration of the element in terms of high-temperature reliability, and thus a positive effect on long-term reliability may be expected.

Features, structures, effects, and the like. described in the above embodiments are included in at least one embodiment of the present disclosure, and are not necessarily limited to only one embodiment. Furthermore, the features, structures, effects, and the like illustrated in each embodiment may be combined or modified for other embodiments by those of ordinary skill in the art to which the embodiments belong. Therefore, contents related to such combinations and modifications should be interpreted as being included in the scope of the present disclosure.

Further, the description has been focused on the embodiment above, but this is only an example and does not limit the present disclosure. Those of ordinary skill in the art to which the present disclosure pertains will be able to see that various modifications and applications not exemplified above are possible without departing from the essential characteristics of the present embodiment. For example, each component specifically illustrated in the embodiment may be implemented by modification. In addition, differences related to such modifications and applications should be construed as being included in the scope of the present disclosure stipulated in the appended claims.

INDUSTRIAL APPLICABILITY

The present disclosure may provide the light-emitting device using the micrometer-sized (μm) semiconductor light-emitting element, and the method for manufacturing the same.

The invention claimed is:

1. A light-emitting device using a micrometer-sized semiconductor light-emitting element, the light-emitting device comprising:
   a substrate including a plurality of individual device areas;
   a semiconductor structure located in each of the plurality of individual device areas, wherein the semiconductor structure includes a first conductive semiconductor layer, an active layer, and a second conductive semiconductor layer;
   a first electrode electrically connected to the first conductive semiconductor layer of the semiconductor structure;
   a second electrode electrically connected to the second conductive semiconductor layer of the semiconductor structure; and
   a light extraction structure located in a gap area located outside of the device area on the substrate,
   wherein the light extraction structure includes:
      a semiconductor protruding structure positioned in the gap area of the substrate, formed through an etching process after stacking or formation of the first conductive semiconductor layer, the active layer, and the second conductive semiconductor layer during a formation process of the semiconductor structure;
      a passivation layer disposed on the semiconductor protruding structure; and
      a metal layer disposed on the passivation layer, and
   wherein the passivation layer and the metal layer have a protrusion shape corresponding to the semiconductor protruding structure.

2. The light-emitting device of claim 1, wherein the gap area is located between two adjacent individual device areas among the plurality of individual device areas.

3. The light-emitting device of claim 1, wherein the light extraction structure includes a semiconductor protruding structure located on the substrate.

4. The light-emitting device of claim 1, wherein the light extraction structure includes an omni-directional reflector (ODR).

5. The light-emitting device of claim 1, wherein the metal layer is connected to at least one of the first electrode or the second electrode.

6. The light-emitting device of claim 1, wherein the semiconductor protruding structure contains a same material as the semiconductor structure.

7. The light-emitting device of claim 1, wherein a reflective metal layer is located on a side surface of the semiconductor structure.

8. The light-emitting device of claim 7, wherein the reflective metal layer is connected to at least one of the first electrode or the second electrode, of the semiconductor structure.

9. The light-emitting device of claim 1, further comprising an insulating layer disposed on the light extraction structure located in the gap area.

10. The light-emitting device of claim 9, further comprising:
    a first wiring electrode connected to the first electrode; and
    a second wiring electrode connected to the second electrode.

11. The light-emitting device of claim 10, wherein at least one of the first wiring electrode or the second wiring electrode is located on the insulating layer.

* * * * *